(12) United States Patent
Arndt et al.

(10) Patent No.: US 6,208,008 B1
(45) Date of Patent: Mar. 27, 2001

(54) INTEGRATED CIRCUITS HAVING REDUCED STRESS IN METALLIZATION

(75) Inventors: Kenneth C. Arndt, Wappingers Falls; Richard A. Conti, Mt. Kisco; David M. Dobuzinsky, Hopewell Junction; Laertis Economikos, Wappingers Falls, all of NY (US); Jeffrey P. Gambino, Gaylordsville, CT (US); Peter D. Hoh; Chandrasekhar Narayan, both of Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/260,702

(22) Filed: Mar. 2, 1999

Related U.S. Application Data

(62) Division of application No. 09/003,107, filed on Jan. 6, 1998, now Pat. No. 5,939,335.

(51) Int. Cl.[7] .................................................. H01L 29/41
(52) U.S. Cl. ............................................. 257/510; 257/513
(58) Field of Search ................................... 257/623, 640, 257/626, 510, 513, 520, 521, 739

(56) References Cited

U.S. PATENT DOCUMENTS

| | | | |
|---|---|---|---|
| 4,352,724 | * | 10/1982 | Sugishima et al. . |
| 4,425,183 | * | 1/1984 | Maheras et al. . |
| 4,462,882 | | 7/1984 | Horwitz . |
| 4,729,815 | * | 3/1988 | Leung . |
| 4,780,429 | * | 10/1988 | Roche et al. . |
| 4,981,551 | * | 1/1991 | Palmour . |
| 4,981,810 | | 1/1991 | Fazan et al. . |
| 5,106,770 | * | 4/1992 | Bulat et al. . |
| 5,317,193 | * | 5/1994 | Watanabe . |
| 5,416,048 | * | 5/1995 | Blalock et al. ............... 437/228 |
| 5,489,548 | * | 2/1996 | Nishioka et al. . |
| 5,514,624 | * | 5/1996 | Morozumi . |
| 5,830,797 | * | 11/1998 | Cleeves . |

FOREIGN PATENT DOCUMENTS

| | | |
|---|---|---|
| 5-90258 | 4/1993 | (JP) . |
| 9-232305 | 9/1997 | (JP) . |
| WO 98/42020 | 9/1998 | (WO) . |

OTHER PUBLICATIONS

EPO Search Report Dated Jul. 27, 1999.
S. Lee & K. Lee, The Optimization of Passivation Layout Structure for Reliability Improvement of Memory Devices, Jpn. J. Appl. Phys., vol. 35, Part 1, No. 10, pp. 5462–5465 (Oct. 1996).*

* cited by examiner

*Primary Examiner*—David Hardy
(74) *Attorney, Agent, or Firm*—Ratner & Prestia; Steven Capella, Esq.

(57) ABSTRACT

The stresses commonly induced in the dielectrics of integrated circuits manufactured using metal patterning methods, such as reactive ion etching (RIE) and damascene techniques, can be reduced by rounding the lower corners associated with the features which are formed as part of the integrated circuit (e.g., the interconnects) before applying the outer (i.e., passivation) layer. In connection with the formation of metal lines patterned by a metal RIE process, such corner rounding can be achieved using a two-step metal etching process including a first step which produces a vertical sidewall and a second step which tapers lower portions of the vertical sidewall or which produces a tapered spacer along the lower portions of the vertical sidewall. This results in a rounded bottom corner which improves the step coverage of the overlying dielectric, in turn eliminating the potential for cracks. For metal lines patterned by damascene, such corner rounding can be achieved using a two-step trench etching process including a first step which produces a vertical sidewall, and a second step which produces a tapered sidewall along lower portions of the vertical sidewall.

11 Claims, 1 Drawing Sheet

INTEGRATED CIRCUITS HAVING REDUCED STRESS IN METALLIZATION

This application is a divisional of U.S. patent application Ser. No. 09/003,107, filed on Jan. 6, 1998, which has been allowed as U.S. Pat. No. 5,939,335.

TECHNICAL FIELD

The present invention is generally directed to the manufacture of integrated circuits and, in particular, to the prevention of cracking in the final passivation layer of an integrated circuit by reducing stress in the surrounding dielectrics.

BACKGROUND OF THE INVENTION

Current metal patterning methods, including reactive ion etching (RIE) and damascene techniques, use anisotropic etching processes that make it possible to produce patterns having features with dimensions on the order of sub-half micron in size. In practice, such anisotropic etching results in the development of sharp corners (i.e., when viewed through the cross-section of the metal layer).

For example, FIGS. 1A and 1B schematically illustrate integrated circuits 1, 2 which have been produced using an RIE process (FIG. 1A) and a damascene process (FIG. 1B), respectively. In each case, desired metallized features 3 (e.g., conductor lines formed of aluminum) are shown associated with a suitable substrate 4 (e.g., formed of $SiO_2$). For the RIE-prepared integrated circuit 1 of FIG. 1A, an outer layer 5 (e.g., including $Si_3N_4$ and $SiO_2$) is applied over the features 3 and the substrate 4. For the damascene-prepared integrated circuit 2 of FIG. 1B, the metallized features 3 are received within trenches 6 formed in the substrate 4.

In practice, such processing results in sharp corners 7', 7" (seen through the cross-section of the metallized features 3), respectively, along the tops 8 and at the bottoms 9 of the metallized features 3. The sharp corners 7', 7" tend to cause high stresses in the surrounding dielectrics. These high stresses have been found to cause cracks in the final passivation layer. S. Lee & K. Lee, "The Optimization of Passivation Layout Structure for Reliability Improvement of Memory Devices," Jpn. J. Appl. Phys., Vol. 35, Part 1, No. 10, pp. 5462–65 (Oct. 1996). These high stresses have also been found to cause "cratering" in the fuses which have come to be formed on integrated circuits for various purposes, when such fuses are laser-blown.

In an effort to reduce stress-induced cracking, Lee et al. suggest increasing the passivation thickness. The authors recognize, however, that the beneficial effects of this suggestion are limited by a corresponding increase in the brittleness of a thicker layer. U.S. Pat. Nos. 5,416,048; 4,425,183; and 4,352,724 each suggest rounding of the top corners 7' to achieve various improvements in the etching of semiconductors. For U.S. Pat. Nos. 5,416,048 and 4,425,183, and as is further disclosed in U.S. Pat. No. 4,780,429, the etched metallized features 3 can further be provided with sloping sides to achieve various other improvements. The sloping sides resulting from such manufacturing processes are formed, however, using the oxides of the metals which form the metallized features 3. Such formation has been found to yield moderately high leakage currents and, at times, to extend across the gap which must be preserved between the adjacent metallized features 3 (e.g., adjacent metal vias or lines).

Therefore, the primary object of the present invention is to reduce deleterious effects, such as cracking of the final passivation layer or "cratering" of the fuse layer of a manufactured integrated circuit, by reducing the high stresses which can be developed in the dielectrics which surround the features being formed on the integrated circuit. Another object of the present invention is to accomplish this in a way which is fully compatible with conventional metal patterning methods, including RIE and damascene techniques.

SUMMARY OF THE INVENTION

These and other objects, which will become apparent, are achieved in accordance with the present invention by rounding bottom corners of the features formed as part of an integrated circuit, such as the "interconnects" of the integrated circuit, before applying the outer (i.e., passivation) layer.

In connection with the formation of metal lines patterned by a metal RIE process, such corner rounding can be achieved using a two-step metal etching process including a first step which produces a vertical sidewall and a second step which tapers lower portions of the vertical sidewall. This process results in a rounded bottom corner which improves the step coverage of the overlying dielectric, in turn eliminating the potential for cracks. Such corner rounding can also be achieved by producing a tapered insulating sidewall along the feature (i.e., the metal line or via) by applying a flowable glass (such as a spin-on-glass) layer to lower portions of the feature, followed by etching of the applied glass layer to form a spacer. This process results in a bottom corner having a sidewall formed from the flowable glass which is tapered, rather than vertical, again improving the step coverage of the overlying dielectric.

For metal lines patterned by damascene, such corner rounding can be achieved using a two-step trench etching process including a first step which produces a vertical sidewall, and a second step which produces a tapered sidewall along lower portions of the vertical sidewall.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not drawn to scale. On the contrary, the dimensions of the various features are arbitrarily expanded or reduced for clarity. Included in the drawing are the following figures.

DETAILED DESCRIPTION OF PREFERRED EMBODIMENTS

In accordance with the present invention, it has been found that the stresses commonly induced in the dielectrics of integrated circuits manufactured using metal patterning methods, including reactive ion etching (RIE) and damascene techniques, can be reduced by rounding the lower corners associated with the features which are formed as part of the integrated circuit (e.g., the interconnects of the integrated circuit) before applying the outer (i.e., passivation) layer. Such corner rounding can be achieved in any of a number of ways, and the processes used to accomplish corner rounding in accordance with the present invention may be freely varied responsive to the specifics of the manufacturing process which is being used to form a particular integrated circuit, the topology of the integrated circuit which is being formed, the materials forming the various elements of the integrated circuit, or such other variables as may pertain to the specific manufacturing process being performed. Examples of these processes are given below, with the understanding that the several embodiments to be described are given only as examples of the many equivalents which may implement the improvements of the present invention.

Figure 1A:
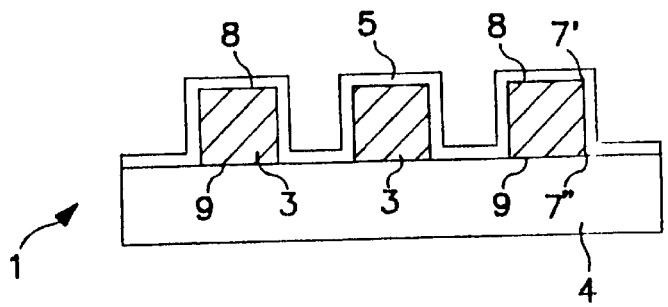
FIG. 1A is a schematic cross-sectional view of an integrated circuit having features produced using known reactive ion etching techniques.
Figure 1B:
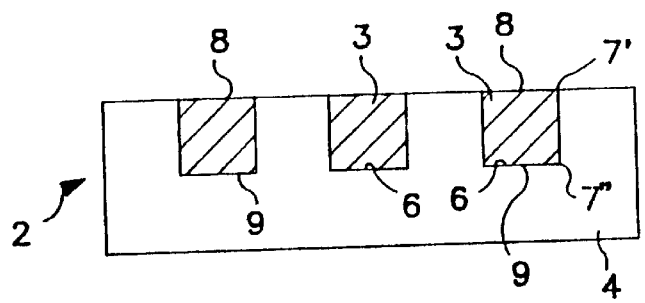
FIG. 1B is a schematic cross-sectional view of an integrated circuit having features produced using known damascene etching techniques.
Figure 2:
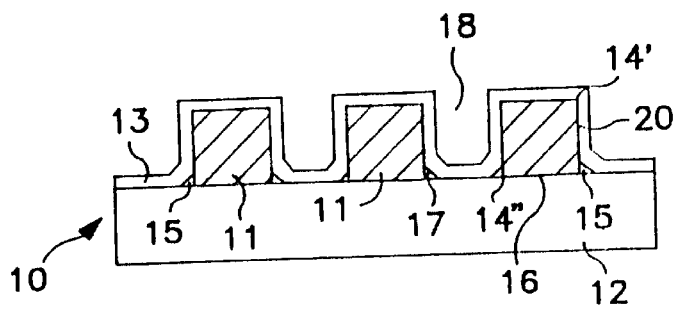
FIG. 2 is a schematic cross-sectional view similar to FIG. 1A, showing the manufacture of an integrated circuit having features produced in accordance with a first embodiment of the method of the present invention.

FIG. 2 shows an integrated circuit 10 which is produced using a metal RIE process. The integrated circuit 10 is formed with desired features, which in the embodiment illustrated include a plurality of conductor lines 11 formed of aluminum. The conductor lines 11 are formed on a suitable substrate 12, which may be formed of $SiO_2$. An outer layer 13 (e.g., including $Si_3N_4$ and $SiO_2$) is applied over the conductor lines 11 and the substrate 12. As previously discussed, using conventional RIE processing to manufacture the integrated circuit 10 would ordinarily result in sharp corners, shown in the view taken through the cross-section of the conductor lines 11, at 14' and 14".

In accordance with the present invention, however, the corners 14" have been rounded by forming beveled $SiO_2$ spacers 15 where the conductor lines 11 meet the substrate 12. The spacers 15 can be obtained by first applying a spin-on-glass (SOG), or other flowable material, along the bottom portions 16 of the conductor lines 11, and by then etching back the applied material to form the desired spacers 15. A spacer 15 formed from a flowable material, for example, by an anisotropic etch such as fluorine-based RIE, will tend to exhibit a taper (shown at 17) rather than being vertical, as is the case for conventional spacers. As a result, the flowable material will tend to produce a "U-shaped" profile in the outer layer 13 (between the conductor lines 11), rather than the square profile which would result from the conforming (deposited) materials traditionally used to produce spacers.

A thin layer (e.g., 25 to 250 nm) of the flowable material is preferably used in forming the spacer 15 so that the resulting structure only partially fills the space (the gap 18) between adjacent interconnects. Forming the narrowest possible spacer 15 is preferred to minimize potentially adverse effects, such as leakage currents extending across the gap 18, when spacer 15 is a conductor. The spin-on-material either can form part of the permanent structure (i.e., for a spin-on-glass) or can be a disposable layer (i.e., a polymer, $B_2O_3$, and the like) which is used to transfer the rounded shape into an underlying film (such as plasma-enhanced chemical vapor deposited $SiO_2$).

The corners 14" where the conductor lines 11 meet the substrate 12 can also be rounded by operating upon the metal which forms the conductor lines 11. For example, referring to FIG. 3, RIE can be used to taper the conductor lines 11 to form a beveled region 19 which is integral with the remainder of the feature 3. In accordance with the present invention, however, such etching is limited to the bottom portions 16 of the conductor lines 11 (i.e., near the end of the etch) to minimize potentially adverse effects such as leakage currents extending across the gap 18.

Figure 3:
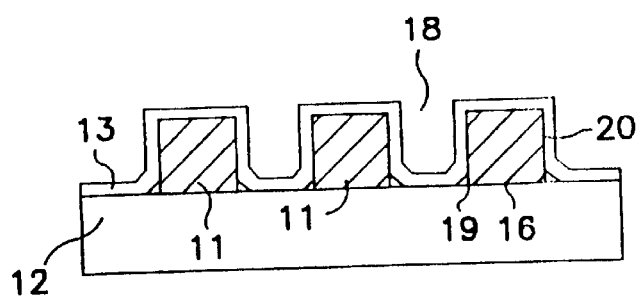
FIG. 3 is a schematic cross-sectional view similar to FIG. 1A, showing the manufacture of an integrated circuit having features produced in accordance with a second, alternative embodiment of the method of the present invention.

The metal profile shown in FIG. 3 can be achieved using a two-step RIE process. The first step of the process uses a chlorine-based etch to produce a vertical profile in portions 20 (e.g., the upper 50% to 90% of the final, total height) of the conductor lines 11. The second step uses a modified chlorine-based etch to produce an increased amount of etch by-products on the vertical sidewall, developing the beveled region 19 along the bottom portions 16 of the conductor lines 11. One way to achieve such a beveled region 19 is to reduce the bias voltage or power applied during the second step of the etching process. It is presently believed that this would be easiest to implement by tapering the lower layers of a multi-layer stack (such as titanium or TiN refractory metals underneath an aluminum layer). In such case, the first step would etch completely through the aluminum layer, but would be caused to stop on the refractory metal underlayer. The second step would etch the refractory metal underlayer, producing a taper in the underlayer (or underlayers).

Figure 4:
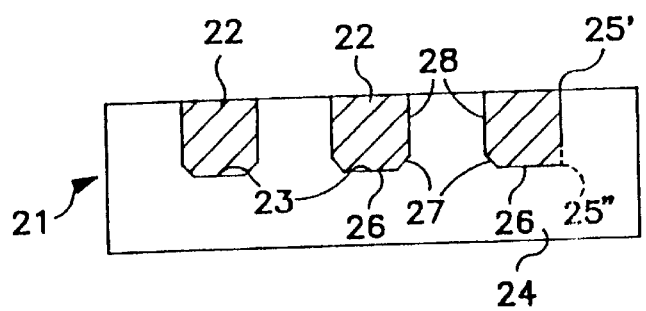
FIG. 4 is a schematic cross-sectional view similar to FIG. 1B, showing the manufacture of an integrated circuit having features produced in accordance with the present invention.

FIG. 4 shows an integrated circuit 21 which is produced using a damascene process. The integrated circuit 21 is formed with desired features, which in the embodiment illustrated again include a plurality of conductor lines 22 formed of aluminum. The conductor lines 22 are received in a series of trenches 23 created in a suitable substrate 24. The substrate 24 may be formed, for example, of $SiO_2$. As previously discussed, conventional damascene processing used to manufacture the integrated circuit 21 would ordinarily result in sharp corners, shown in the view taken through the cross-section of the conductor lines 22, at 25' and 25". In accordance with the present invention, however, the bottom portions 26 of the trenches 23 have been tapered, forming beveled regions 27 for rounding the corners 25" of the metal damascene conductor lines 22.

Such corner rounding can be achieved using a two-step etching process. The first step of the process uses a non-polymerizing, fluorine-based, dry etch to form vertical sidewalls in upper portions 28 (e.g., the upper 50% to 90% of the final, total depth) of the trench 23. The second step uses a polymerizing dry etch to taper the bottom of the trench 23, forming the beveled regions 27 along the bottom portions 26 of the trench 23. Alternatively, the second step could be an isotropic wet or dry etch to round the bottom portions 26 of the trench 23. This alternative second step would tend to cause widening at the top of the trench 23, however, which may be undesirable for some applications.

The embodiments described above, and the several methods described for implementing such embodiments, provide a practical way to reduce the stress in dielectrics that surround the interconnects of an integrated circuit construction. As previously indicated, however, such embodiments are given only as examples of the many circuit constructions and processing steps which can be used to implement an integrated circuit in accordance with the present invention. Therefore, it will be understood that various changes in the details, materials, and arrangement of parts which have been described and illustrated in order to explain the nature of the present invention may be made by those skilled in the art within the principles and scope of the invention as expressed in the following claims.

What is claimed:

1. An integrated circuit comprising a substrate, an interconnect formed on the substrate, and a passivation layer formed on the interconnect and the substrate, wherein the interconnect has substantially vertical sidewalls extending between top portions of the interconnect and bottom portions of the interconnect, and a rounded corner portion extending along the bottom portions of the interconnect, thereby reducing stress in the passivation layer, wherein the rounded corner portion is a spacer positioned along the bottom portions of the interconnect, and wherein the spacer is formed of a flowable insulating material.

2. The integrated circuit of claim 1 wherein the substrate is formed of $SiO_2$.

3. The integrated circuit of claim 1 wherein the interconnect is formed of a metal.

4. The integrated circuit of claim 1 wherein the passivation layer includes $Si_3N_4$.

5. The integrated circuit of claim 1 wherein the flowable insulating material is spin-on-glass.

6. The integrated circuit of claim 1 wherein the flowable insulating material has a thickness of from 25 to 250 nm.

7. The integrated circuit of claim 1 wherein an upper 50% to 90% of the sidewalls of the interconnect have a substantially vertical profile.

8. An integrated circuit comprising a substrate, a conductor line received within a damascene trench formed in the substrate, and a passivation layer formed on the conductor line and the substrate, wherein the trench has substantially vertical sidewalls extending between top portions of the trench and bottom portions of the trench, and a beveled region formed in the bottom portions of the trench along the vertical sidewalls, thereby reducing stress in the passivation layer.

9. The integrated circuit of claim 8 wherein an upper 50% to 90% of the sidewalls of the trench have a substantially vertical profile.

10. The integrated circuit of claim 8 wherein the substrate is formed of $SiO_2$.

11. The integrated circuit of claim 8 wherein the conductor line is formed of a metal.

* * * * *